(12) United States Patent
Amiot et al.

(10) Patent No.: US 7,871,007 B2
(45) Date of Patent: *Jan. 18, 2011

(54) MICROCIRCUIT CARD ATTACHED TO AN ADAPTER BASE, CARD BASE AND MANUFACTURING METHOD

(75) Inventors: Lucien Amiot, Jouy-En-Josas (FR); Barry Mosteller, Downington, PA (US)

(73) Assignee: Oberthur Technologies, Levallois-Perret (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/338,332

(22) Filed: Dec. 18, 2008

(65) Prior Publication Data

US 2009/0095817 A1    Apr. 16, 2009

Related U.S. Application Data

(63) Continuation of application No. 11/828,571, filed on Jul. 26, 2007, now Pat. No. 7,559,478, which is a continuation of application No. 10/816,827, filed on Apr. 5, 2004, now Pat. No. 7,264,172.

(30) Foreign Application Priority Data

Apr. 3, 2003   (FR)   ................................ 03 04156
Sep. 30, 2003  (FR)   ................................ 03 11437

(51) Int. Cl.
    *G06K 7/00*    (2006.01)
    *G06K 19/00*   (2006.01)
    *G06K 19/06*   (2006.01)
(52) U.S. Cl. .................. 235/486; 235/487; 235/492
(58) Field of Classification Search ............ 235/486, 235/487, 492; 257/678, 679; 361/737
See application file for complete search history.

(56) References Cited

U.S. PATENT DOCUMENTS

| | | | |
|---|---|---|---|
| 5,671,525 A | | 9/1997 | Fidalgo |
| 6,151,511 A | * | 11/2000 | Cruciani ..................... 455/558 |
| 6,288,904 B1 | * | 9/2001 | Houdeau et al. ............ 361/760 |
| 6,467,692 B1 | | 10/2002 | Tarantino et al. |
| 6,471,127 B2 | * | 10/2002 | Pentz et al. ................. 235/487 |
| 6,484,935 B1 | * | 11/2002 | Fischbacher ................ 235/376 |
| 6,561,432 B1 | | 5/2003 | Vedder et al. |
| 6,685,097 B1 | | 2/2004 | Housse |
| 6,719,206 B1 | | 4/2004 | Bashan et al. |
| 6,776,347 B2 | | 8/2004 | Nishikawa et al. |
| 6,786,419 B2 | | 9/2004 | Kayanakis |
| 6,964,377 B1 | | 11/2005 | Haghiri et al. |

(Continued)

FOREIGN PATENT DOCUMENTS

DE    298 21 087    2/1999

(Continued)

*Primary Examiner*—Thien M. Le
*Assistant Examiner*—April A Taylor
(74) *Attorney, Agent, or Firm*—Young & Thompson

(57) ABSTRACT

A microcircuit card (31) comprising a microcircuit and a card body, characterized in that this card body is formed of a base (10) in which is formed a cavity provided with a bottom and an internal part fixed in the cavity and to which the microcircuit is joined, the internal part and the microcircuit (12) together constituting at least a part of a second microcircuit card (11) including at least a part of the body of said second card.

6 Claims, 6 Drawing Sheets

U.S. PATENT DOCUMENTS

| | | | |
|---|---|---|---|
| 6,994,262 B1 * | 2/2006 | Warther | 235/492 |
| 7,000,842 B2 | 2/2006 | Yamaguchi et al. | |
| 7,086,601 B2 * | 8/2006 | Dhers et al. | 235/492 |
| 7,183,636 B1 * | 2/2007 | Boccia et al. | 257/679 |
| 7,264,172 B2 | 9/2007 | Amiot et al. | |
| 7,559,478 B2 * | 7/2009 | Amiot et al. | 235/486 |

FOREIGN PATENT DOCUMENTS

| | | |
|---|---|---|
| DE | 198 26 428 | 12/1999 |
| DE | 100 52 444 | 5/2002 |
| EP | 0 846 822 | 6/1998 |
| EP | 0 869 452 | 10/1998 |
| FR | 2 837 594 | 9/2003 |
| JP | 2001-195550 | 7/2001 |
| JP | 2002-177039 | 6/2002 |
| WO | WO 00 73989 | 12/2000 |

* cited by examiner

MICROCIRCUIT CARD ATTACHED TO AN ADAPTER BASE, CARD BASE AND MANUFACTURING METHOD

This application is a continuation application of Ser. No. 11/828,571, filed Jul. 26, 2007, currently pending, which is a continuation of U.S. Ser. No. 10/816,827, filed Apr. 5, 2004 and patented as U.S. Pat. No. 7,264,172 B2 on Sep. 4, 2007, which claims priority to French Application No. 0311437, filed Sep. 30, 2003 and French Application No. 0304156, filed Apr. 3, 2003. The teachings of the above applications are hereby incorporated by reference. Any disclaimer that may have occurred during prosecution of the above referenced applications is hereby expressly disclaimed

FIELD OF THE INVENTION AND TECHNICAL PROBLEM

The invention concerns the field of microcircuit cards.

It is known that a microcircuit card comprises a card body to which is fixed a module comprising a printed circuit on which is fixed an integrated circuit also known as a "chip". In practice, this chip is fixed in a cavity in the card body, the bottom of which is closed so that it contributes to the secure attaching of the chip.

Such cards are designed to be inserted in a reader equipped with suitable means for cooperating with the integrated circuit for the purpose of exchanging data and/or commands. This cooperation may be effected by means of contact pads provided on the module (conforming in practice to Standard ISO78), or at a distance, without contact. For this cooperation to be able to take place, the card, and therefore the card body, must have a format that the reader in question is capable of reading, and the module must have a given configuration with respect to the card body so that it can take up a given position in the housing provided in the reader to accommodate the card.

The format of these cards is usually standardized, i.e. defined by a standard, for example type ID-1 (the rectangular format of most credit cards) or type ID-000, which is smaller, (a format defined by Standard ISO7816, also known as SIM "plug-in" format, having a smaller rectangular form with one corner cut off.

However in the field of microcircuit cards, the modules are sometimes mounted on a microcircuit card body of non-standard form, different from those provided in Standard ISO7816, and specific to a particular offer of services. As one example of a special form, we may mention the geometrical form of the decoder keys used to obtain access to the programmes of the "CANAL+"® company in France.

It is important to note that the body of a card may not necessarily have a simple rectangular form of necessarily constant thickness, but may take on a great variety of forms, whether in terms of length or width (rectangular or circular or oval, etc.) or thickness.

This variety of possible forms is all the greater in that, in the case of microcircuit cards of the type with no contact, the geometry of the associated reader imposes much fewer constraints on the geometry of those cards, which makes it possible to define for them new specific forms according to new needs such as the concern for improved ergonomics for the user (ease of grasping, protection against shocks, mechanical connection to other objects, comfort for keeping in one's pockets, etc.). It may also be noted in this connection that the size of certain current cards is close to that of keys and makes it possible to envisage storing them in key carriers.

However commercially available machine tools for mounting modules are usually suitable for mounting modules on standard cards, in practice cards of ID-1 format. These machine tools are relatively sophisticated and costly, having to be capable of processing a high rate of throughput of cards, typically 4,000 cards per hour, while limiting the number of cards rejected. In order to mount modules on specially shaped cards, it is thus necessary in principle to adapt the above-mentioned machine tools, or to construct new machine tools dedicated to each specific form of card, which presents obvious problems of cost (for the design and manufacture of the machines) and of flexibility (adaptation to the production load of the different forms of card).

The object of the invention is to overcome this drawback by adapting the structure and manufacture of microcircuit cards in such a way as to reduce the cost and complexity of manufacture, even in the case of card bodies of special form.

Furthermore, in the course of the life of a microcircuit card, the module may need to be used in card readers adapted to a different format of microcircuit card from that intended at the time of manufacture or sale of the microcircuit card. In this way, a module initially mounted on an ID-1 format card can be used in an ID-000 format card after such an ID-000 format card, its form presplit from the ID-1 card, has been detached from the latter. However it is no longer possible subsequently for this card to be read by a card reader designed to read cards of a larger format, in particular the initial ID-1 format.

The object of the invention is also to enable use of a module mounted on a card in a card reader designed for a different format of card, when this second format is larger than the first.

TECHNICAL SOLUTION PROVIDED BY THE INVENTION

The invention provides to this end a microcircuit card comprising a microcircuit and a card body, characterized in that this card body consists of a base in which is provided a cavity provided with a bottom and an internal part fixed inside this cavity and to which the microcircuit is joined, this internal part and the microcircuit together constituting at least a part of a second microcircuit card, including at least a part of the body of that second card.

The internal part (and the microcircuit which is joined to it) is fixed to the base in a manner such that the card so obtained can be transported, carried about and used in the same way that a card originally manufactured in the format of the base would be used. For example, the card can be turned over so that the opening of the said cavity faces downward without the second card (or that part of the second card) being able to fall out.

What in practice distinguishes what is known as a "microcircuit card" from a simple base-microcircuit assembly is that this card has a format and a location of the microcircuit which enable it to be read in a card reader. This card may therefore be an ordinary card conforming to a standard, but it may also be a special card designed for a reader specific to a particular offer of services or producer. However the internal part and the microcircuit which is joined to it do not necessarily constitute the whole of such a card, and may only be a part of it, obtained for example by simply cutting out from the card body of this original card.

In this way, any type of card form can be obtained or used more easily, simply by assembling a card of standard form, for example conforming to Standard ISO6716, or a part cut out of this card including the microcircuit, with a base of the specific format desired. By means of the invention, the cost of manufacture of special format cards is reduced, since the costly operations of mounting the microcircuit are carried out on a standard card.

This applies in particular in the case in which the microcircuit is mounted on a module constituting together with the internal part that part at least of the second card.

It will be understood that the base serves as an adapter between the format of the assembly composed of the internal part and the microcircuit joined to it, and the final format.

Also by means of the invention, a user can change the form of a microcircuit card at any time during the life of said second card by fixing said second card (or a part of it including the microcircuit) to an adapter base. This method is even reversible, provided that the base comprises a cavity adapted to accommodate the whole of said second card and that the mode of attaching of the latter is removable, in which case it is possible to separate this second card from its base and use it in a reader adapted to the reading of its original format.

The concept of base embraces any possible external form. It may take the form of a base with an external form conforming to Standard ISO7816 or a special form such as that of the "CANAL+"® key in France. It may also be a fanciful form, for example a reproduction of the form of a butterfly, or a cylindrical form, etc. In general, the card base is made of a plastic, such as polyester, polyvinyl chloride (PVC), polycarbonate, polyethylene terephthalate (PET) or polysulphone, in particular.

The base may also be a housing, for example a frame, adapted to protect the internal part of its microcircuit while having an ergonomic form for the user with advantageously a linking portion for connecting it to another object, for example a hole for the passage of a key-ring or for a chain, etc.

The base is preferably more mechanically robust than the second card.

It is advantageous if the internal part forming the body (or part of the body) of said second microcircuit card is at least as flexible as said base. This makes it possible to prevent said second card (or part of the second card) from becoming detached, when the base is flexed, due to the stresses imposed on the attachment of said second card to the base, especially if this attachment is not permanent.

It is advantageous if the length and width of the cavity is substantially equal to those of said second card (or part of the card). It is thus possible to determine the position of the microcircuit card in said base by using the edges of said cavity. This positioning of the microcircuit card is necessary to ensure that the contact pads of the card (or part of the card) thus positioned in the cavity of the base are actually in the positions provided in a reader adapted to the format of said base. However, this positioning is of minor importance in the case of a card of the type having no contacts.

Nevertheless, this correspondence between lengths and widths does not necessarily imply that the internal part, together with the microcircuit, occupy the whole area of the cavity; thus it is possible to provide spaces between the internal part and the edges of the cavity into which, for example, a tool may be inserted for the purpose of detaching the internal part from the base. Similarly, the mention of length and width of this internal part does not imply any condition respecting the form of this internal part, which may be rectangular, but may just as well be polygonal, or even circular or oval, etc.

It is advantageous if the depth of said cavity is substantially equal to the thickness of said second card (or part of the second card). In this way, the base and the internal part of the second microcircuit card, once assembled, will be substantially equal in size to a conventional card having the form of the base. Thus if the form of the base is adapted to a commercial card reader, said card will also be adapted to being read by that reader. It should be noted that mention of a thickness of the second card in no way implies that the internal part is necessarily of constant thickness; it means only that the cavity is of such a depth that the internal part can be accommodated within the depth of the cavity: this depth may be constant and at least equal to the greatest thickness of the second card (or part of the second card) or may have variations corresponding to possible variations in thickness of the second card or part of the second card.

The bottom of the cavity may be closed, or on the contrary open in limiting itself to an edge following the outline of the cavity. In the case in which the cavity is designed so as to enable the introduction of the second card (or a part of it) by an edge of the base, that is to say that the cavity may be considered as a slot formed in the thickness of the base, the cavity may be delimited, opposite said bottom, by a closed or open wall, for example having the same geometry as the bottom.

Such an embodiment of the invention, according to which the base comprises a slot for the insertion of the card before it is fixed, may appear to have similarities with that proposed by the document WO-03/009220. However it is important to emphasize that this document relates to a card-carrier case adapted to protect a card of credit card type when it is not being used while allowing it to come out entirely or partially at the time of use. Thus this document neither describes nor suggests fixing a "small" microcircuit card in a base for obtaining another microcircuit card, that is to say another card in which the microcircuit of the small card which can be read in without the small card having to come out from the base (thus without dispensing with fixing this small card in the base), or without having to open the base.

In a first embodiment, said second microcircuit card is so fixed in said base as to be removable. It is thus possible to change the base at any time in the life of the second card. Such a removable mode of fixing may be achieved, for example, by jamming the internal part or retaining it by clipping in the cavity of the base, while enabling the internal part to be subsequently detached by means of a tool inserted in a zone left free between the circumference of the internal part and that of the cavity, or pushed through an opening made in the bottom of the cavity: the bottom may indeed be closed (see below), which contributes to the security of the microcircuit or of the module, or may possess one or more openings (provided that this bottom is present in part of the section of the cavity; this cavity is thus not a simple window going right through the whole thickness of the base).

In a second embodiment, said second microcircuit card is not removable from said base. This may be necessary if it is desired that the microcircuit or the module should remain permanently fixed to its base. This is useful in particular in the case of identity cards bearing on the base information concerning the holder (name, photo, etc.) which must remain indissociable from the microcircuit for security reasons. This is also useful when the base is adapted to protect the internal part and the microcircuit against the risk of shocks or scratches of the risk of loss.

It is advantageous if said second microcircuit card is in conformity with Standard ISO7816.

It is preferable for said second microcircuit card to conform to format ID-000 of Standard ISO7816. Among the cards sufficiently small to be inserted in a portable card base, format ID-000 cards are indeed among the most widespread, and there also exist tried and tested machine tools and manufacturing methods for mass production of these format ID-000 cards. Thus, in particular, a standard manufacturing method can be used to produce a plug-in type card in ID-000 format (that is to say a card in ID-000 format which can be detached from a format ID-1 card), detach the ID-000 card, and place it in said base.

The second card (or part of second card) may also be a card of the type without contacts, with an antenna integral with the internal part. This configuration is most particularly worthwhile when the cavity is formed in the base in the form of a slot.

It should be noted that the case in which the internal part constitutes with the microcircuit the entirety of the second card and that in which it constitutes only a part are two cases of application of the invention each having particular advantages.

It is advantageous if said base is in the format of a key, especially of type "CANAL+"®. No machine tools are currently available on the market for mounting microcircuits or modules on "CANAL+"® keys. There is only a limited number of machines developed specially for this type of card specific to the services offered by this supplier. However the invention avoids the need for developing excessively complex machines for the manufacture of such keys: all that is necessary is to start with standard cards manufactured in high volume and mount them, wholly or in part, on bases having the external configuration of such special keys.

As has been mentioned, it may be advantageous if said cavity is provided with lateral recesses to facilitate the insertion of said microcircuit card into said cavity, or its removal from the latter. In a variant of the embodiment, it may be the internal part that is provided with such recesses for this purpose, on its circumference or in its body; there may also be recesses both in the circumference of the cavity and in the circumference of the internal part (or within the latter).

It will be appreciated that in contrast to the method which taught manufacture of a "large" card in ID-1 format and presplitting from it a "small" card in ID-000 format, the invention teaches starting from a small card and mounting it in an adapter so as to obtain a larger format.

Furthermore, the configuration of a card according to the invention may seem to display similarities with some of the configurations proposed in U.S. Pat. No. 5,673,179, which propose a long series of methods of locally reinforcing the body of the card in the immediate proximity of a module. However this similarity is only fortuitous, since the module, mounted in a reinforcing element, can in no way constitute all or part of a card adapted to being read in a reader. In any event, the reinforcing element must be more rigid than the rest of the body of the card, which is in contradiction of what is advantageously provided for by the invention.

The invention also proposes an adapter base adapted to constitute part of a card of said type, that is to say an adapter base having the external geometry of a microcircuit card of a first format and comprising a cavity with a bottom and adapted to accommodate a second microcircuit card in a second format. This second format can advantageously be the ID-000 format. This adapter base can advantageously be provided with lateral recesses and/or means for attachment, for example a hole for the passage of the key ring. As a variant, this second format is of non-standard dimensions.

Lastly, the invention also provides a method for the manufacture of microcircuit cards adapted to give cards of the type mentioned above.

More specifically, it provides a method for the manufacture of a microcircuit card in a first format, comprising a step of attaching a microcircuit to a base, characterized in that the base employed during this attaching step is in a second format different from the first format, and that it comprises a step of preparing an adapter base in the first format and provided with a location for receiving an internal part composed of at least part of the base in the second format and, after the attaching step, an assembly step in the course of which this internal part is fixed in said location in the adapter base.

This method offers the advantage of permitting the use of machines adapted to cards of common format (for example, conforming to Standard ISO7816) to carry out part of the production operations, in particular the mounting of the microcircuit or the module in a base containing the future internal part. For example, it is possible to mount the module on a format ID-000 card using a commercial machine and then place the format ID-000 module on the base, for example in the form of a "Canal+"® key. This makes it unnecessary to use a module mounting machine dedicated to the form of the keys of the type mentioned above.

The location may advantageously, though without limitation thereto, be a cavity. This is because a cavity has the advantage of being easy to make. It suffices to use a milling machine, for example, to form the cavity in the base. It is apparently substantially less easy, though nonetheless possible, to provide a location that is not a cavity since it is, for example, necessary to machine the entire surface of the base which is to receive said second card in order to form attaching components, to add these attaching components, or to mould the form of these fixing components with the rest of the base. As indicated above, this cavity may be a slot formed in the thickness of the base. It is in fact possible to identify two main categories of cavity, i.e. those that open out at a face of the base, and those which open out at an edge of the base.

In accordance with the specific and advantageous characteristics of the manufacturing method according to the invention, similar to those described above concerning the microcircuit card in accordance with the invention, and which may be combined:

the internal part is at least as flexible as said adapter base,
said location is a cavity with a bottom,
the length and width of said cavity are substantially equal to those of said internal part,
the depth of said cavity is substantially equal to the thickness of said internal part,
said cavity comprises lateral recesses,
the attachment formed in the assembly step is detachable,
the attachment formed in the assembly step is permanent,
the base and the microcircuit used in the attaching step, after this attaching step, together form a second microcircuit card of standard type,
the microcircuit is mounted on a module fixed to the base,
said second microcircuit card conforms to Standard ID-000,
the internal part is composed of the whole of the second format base; in variant form, the internal part is constituted by a part of that second card,
the adapter base is in the form of a key, for example a key of the type "Canal+"® in France.
the adapter base is in the form of the frame provided with an attachment member for connecting it to another object.

BRIEF DESCRIPTION OF THE DRAWINGS

The invention will be better understood and other advantages will appear more clearly in the light of the following description, given solely by way of illustrative non-limiting example, with reference to the attached drawings, in which.

DESCRIPTION OF AT LEAST ONE EMBODIMENT

Figure 1:
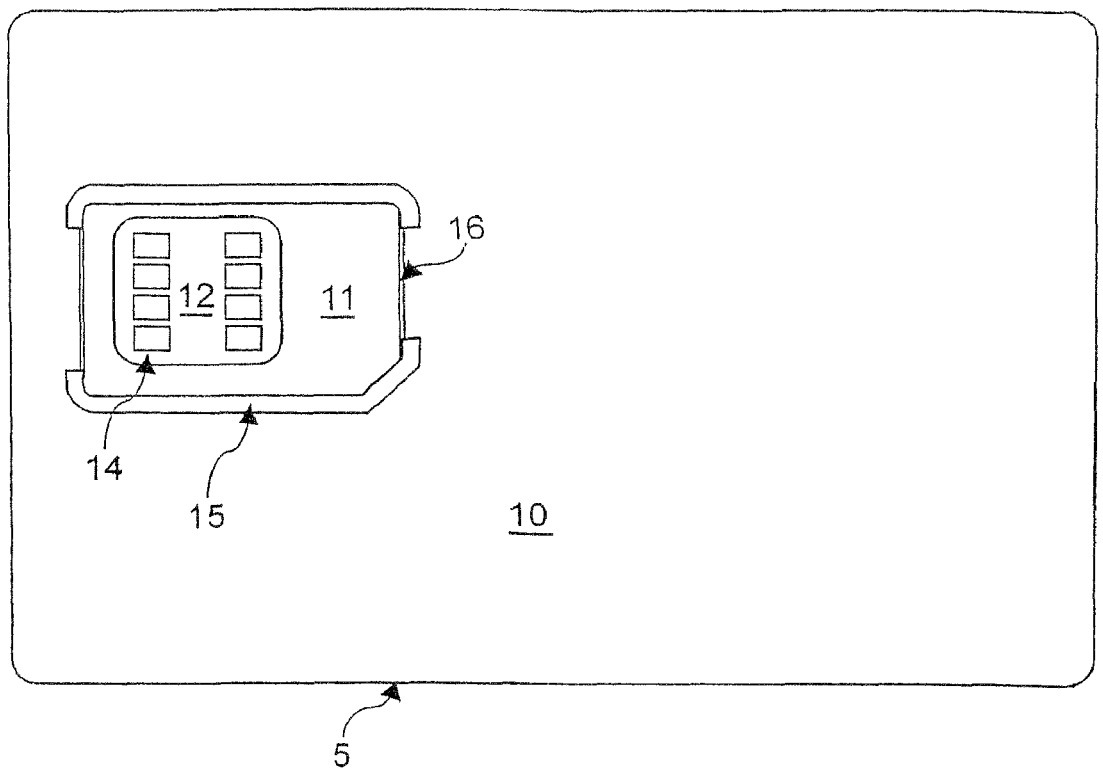
FIG. 1 is a top view of a known card, of SIM plug-in type, representative of the prior art.
Figure 2:
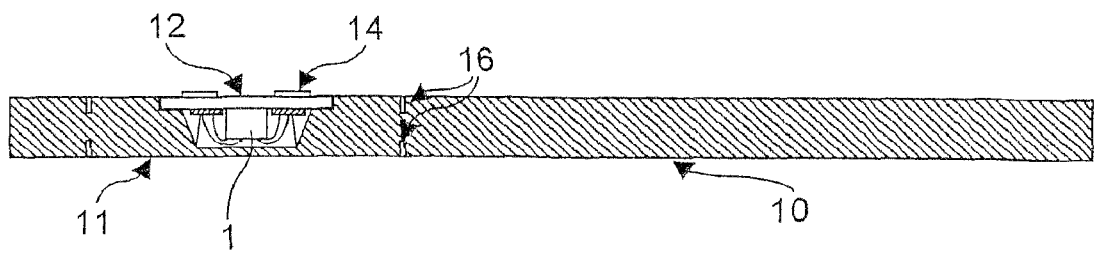
FIG. 2 is a longitudinal cross-section of the same (that is to say along a section following a horizontal line in FIG. 1)

FIGS. 1 and 2 show a card, known as such, of SIM plug-in type. Such a card 5 comprises a base 10 of format ID-1 in which have been formed a cut-out 15 and weakened zones 16, delineating a SIM card 11. The SIM card 11 can be detached from its base 10 by the customer, for example when he wants to insert the card in his telephone adapted to receive cards in format ID-000. The SIM card 11 comprises a module 12 mounted on the ID-1 card before cutting and presplitting of the SIM card 11. In the example under consideration, the module 12 comprises a printed circuit provided on its front surface (shown upwards here) with contacts 14 enabling the card to communicate with a reader, and on its rear surface, a microcircuit 1 fixed in place with adhesive and connected electrically by wires to the printed circuit. In a variant not shown here, the module has no contacts, being adapted to be connected without contacts. This module is fixed in a cavity of the base card which has a closed bottom for reasons of protecting the circuit 1.

Figure 3:
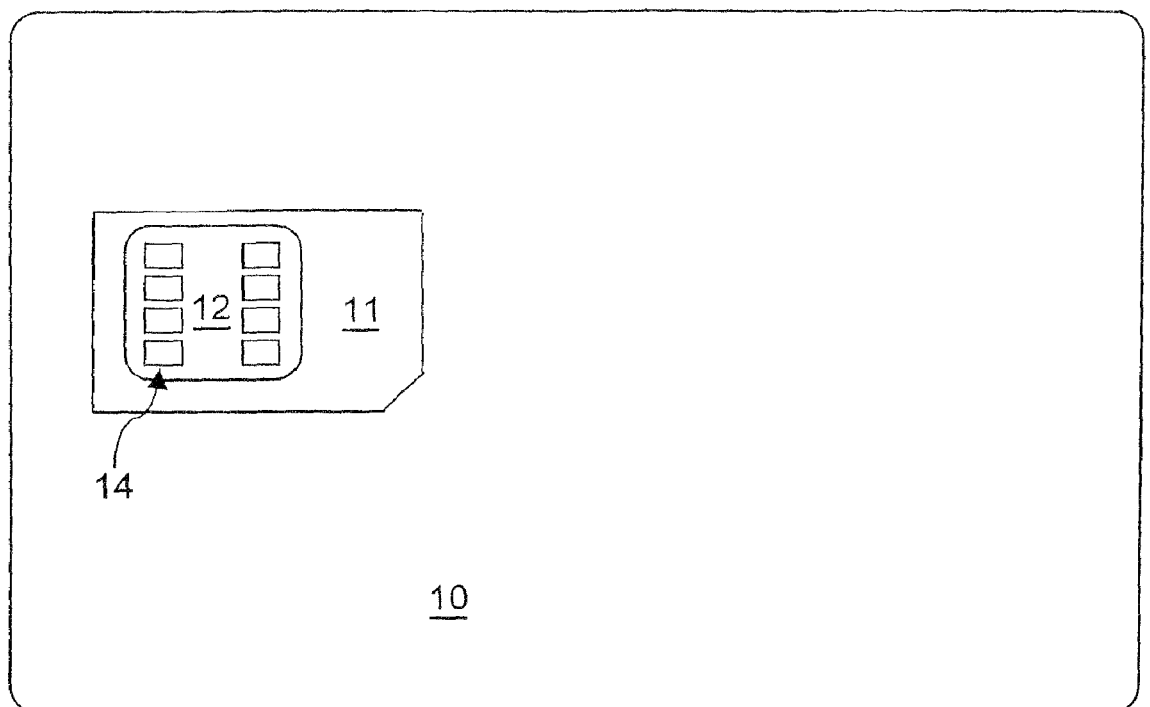
FIG. 3 is a top view of a microcircuit card according to the invention, composed of a base the size of a format ID-1 card with a cavity into which is inserted, according to the invention, a card of format ID-000.
Figure 4:
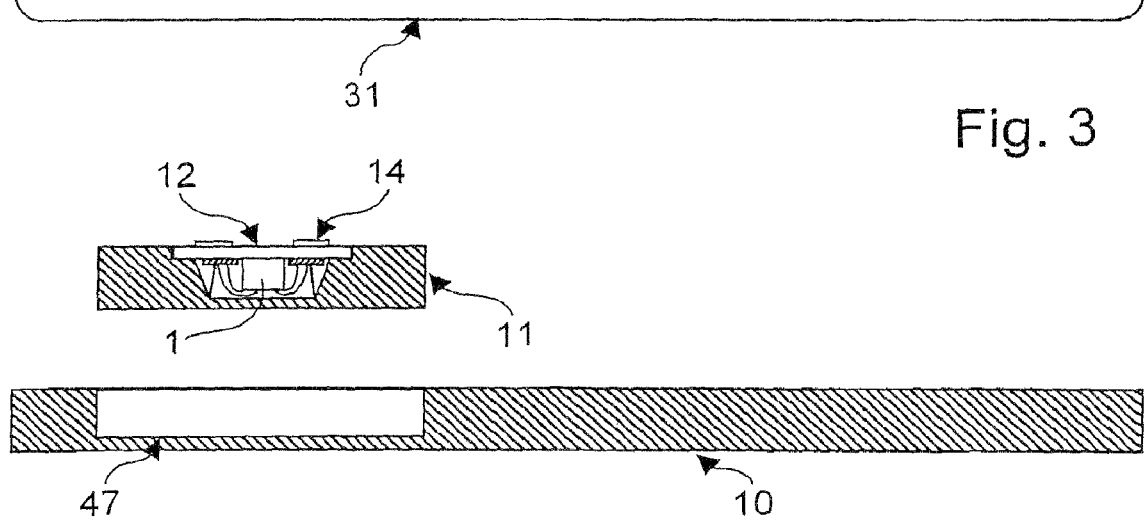
FIG. 4 shows, in longitudinal section, the base and the format ID-000 card shown in FIG. 3, before attaching.
Figure 5:
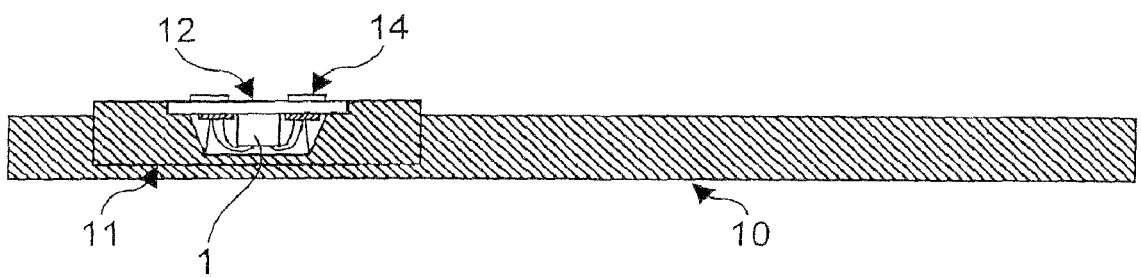
FIG. 5 shows, in longitudinal section, the base and the format ID-000 card shown in FIG. 3, after attaching.

FIGS. 3, 4 and 5 show a microcircuit card 31 according to the invention. It is formed of an adapter base 10 the size of a format ID-1 card with a cavity 47 into which has been inserted, according to the invention, a card 11 of format ID-000, for example that shown in FIGS. 1 and 2. In a variant not shown here, only a part of this card 11 is inserted, this part being composed of a significant part of the card body of this card and its module, and it is this part that is fixed in the cavity. This part is significant in the sense that it is not limited simply to a simple ring surrounding the module; in practice, this part has a surface area at least double that of the module alone so as to enable easy manipulation of this part of the card without risk of damage to the module.

In these FIGS. 3, 4 and 5, the card 11 and the base 10 are the same thickness. Since the cavity has a bottom, the format ID-000 card 11 stands out above the surface of this base 10. However in practice, this excess thickness does not prevent the base 10, equipped with the card 11, from being read like a normal card having the format of this base. In a variant not shown here, it is possible to give the base 10 a slightly greater thickness than that of the card 11 in order for the latter not to stand out above the surface of the card 10.

In an embodiment not shown here, the cavity 47 may go right through, so that there is no bottom. In this case, the card 11 may for example be fixed to the card 10 with adhesive. In such a case, the assembly obtained differs from that shown in FIGS. 1 and 2 in that the internal part of the small card is assembled to the adapter base without material continuity (the internal part and the base have not been made from the same material).

It will be appreciated that the card so obtained is made by a method of manufacturing a microcircuit card according to a first format (here ID-1), comprising a step in which a base has attached to it a module comprising a printed circuit to which an integrated circuit is joined. However in contrast to what is known, the base used during this fixing step is in a second format (here ID-000) different from the first format, and it includes a step of preparation of an adapter base of the first format and provided with a location (here the cavity) to receive an internal part consisting of at least a part (here the whole) of the base in the second format and, after the fixing step, an assembly step in the course of which the internal part is fixed in said location of the adapter base.

Figure 6:
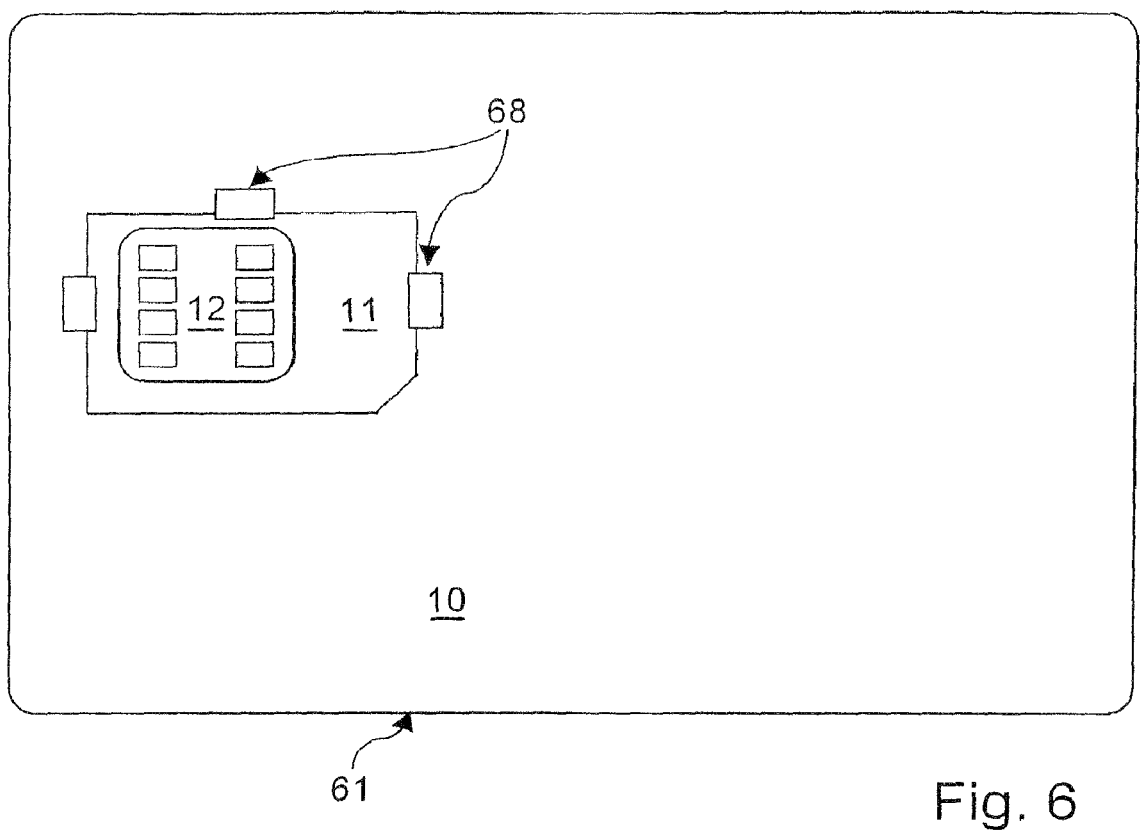
FIG. 6 shows another microcircuit card according to the invention, with a base the size of a format ID-1 card, with a location in which a format ID-000 card has been inserted, viewed from above
Figure 7:
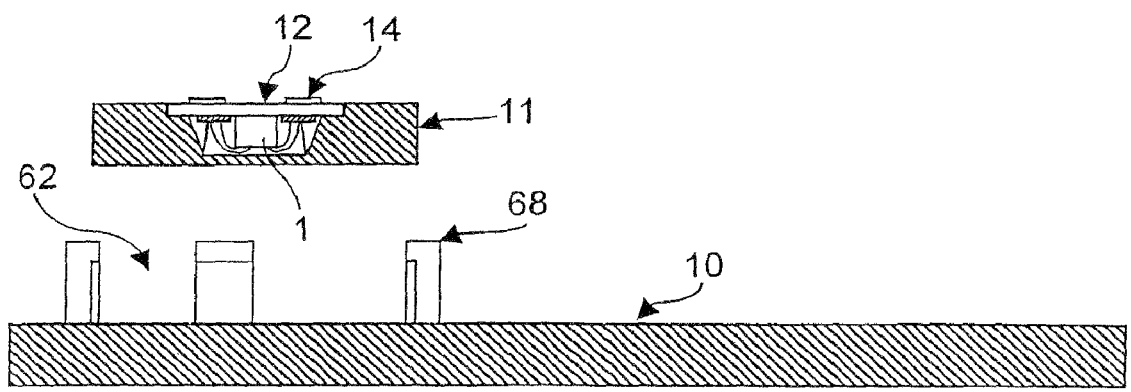
FIG. 7 shows the base and the format ID-000 card shown in FIG. 6, before attaching according to the manufacturing method of the invention, in section.
Figure 8:
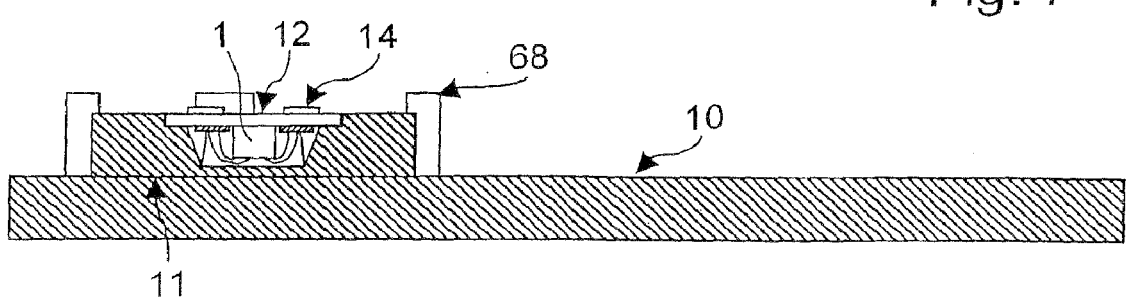
FIG. 8 shows the base and the format ID-000 card of FIG. 6 after attaching, in section.

FIGS. 6, 7, 8 show a microcircuit card identical to the one shown in FIGS. 3, 4, 5, except that to form the card 61, the card 11 is fixed in a location 62 of the base 10 which is not a cavity. This location is formed of projecting nipples 68 which are beak-shaped, enabling the card 11 to be clipped on to the base 61. This type of configuration is used in particular when the adapter base is less thick than the maximum accepted by the reader in which the assembly is to be read.

Figure 9:
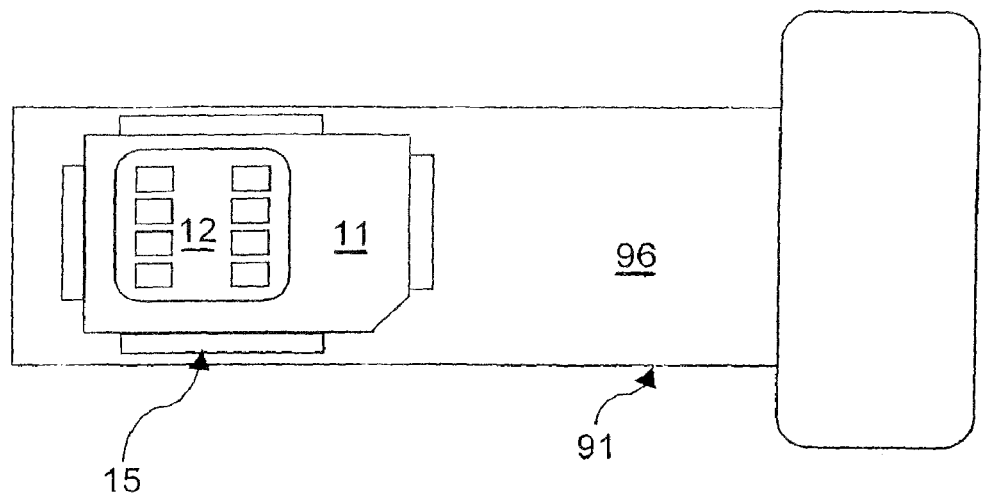
FIG. 9 shows yet another microcircuit card according to the invention, in the form of a key, the base of which includes a cavity into which has been inserted, in accordance with the invention, a format ID-000 card, viewed from above.
Figure 10:
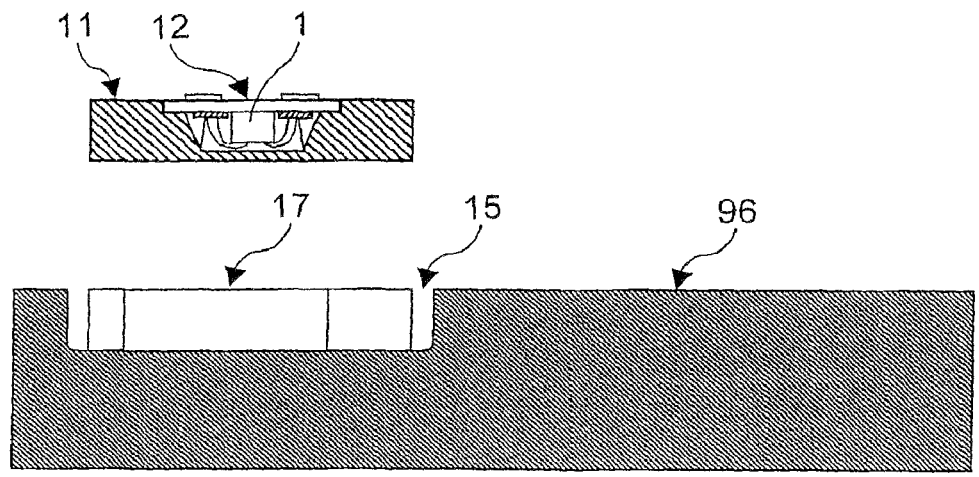
FIG. 10 shows the key and the format ID-000 card shown in FIG. 9, before insertion of the latter in the cavity of the key, in partial cross-section.
Figure 11:
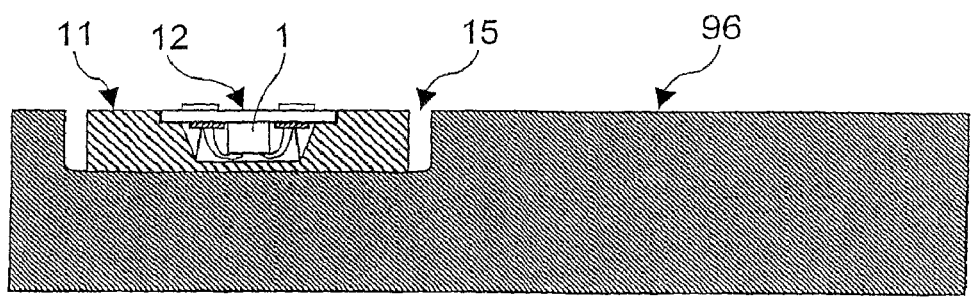
FIG. 11 shows the key and the format ID-000 card shown in FIG. 9, after insertion of the latter in the cavity of the key, according to the manufacturing method of the invention, in section.

FIGS. 9, 10 and 11 show a microcircuit card 91 with its base 96 in the form of a key (here "CANAL+"® type), comprising a cavity 17 into which has been inserted, according to the invention, a card 11 of format ID-000. Recesses 15 have here been provided around the cavity 17 to facilitate insertion of the card 11 in the cavity 17 and, if appropriate, extraction of the card 11 from the cavity 17, for example by inserting a fingernail or a tool. The base 16 may have been machined beforehand, by a milling machine for example, to form the cavity 17 and the recesses 15.

The cavity 17 is substantially equal in size to the card 11. The fit between the card 11 and the base 14 can be adjusted so that the card 11 is fixed in the cavity 17 so that it is either removable or not. The fit to may be, for example, sliding, tight or jammed, depending on whether or not it is desired that the card 11 should be removable. The card 11 can also be fixed in the cavity 17 with adhesive if it is desired that the card 11 should not be removable, as in the case of identity cards, for example.

It may be observed that where the card 11 is a card with an interface with contacts, the contacts 14 of course remain visible after the card 11 is fixed, so that the card can communicate with a reader in the normal way.

The card 11 may also, though without limitation thereto, be of any format conforming to Standard ISO7816, for example format ID-1 or ID-00. It may also be a smaller card cut out of a card conforming to Standard ISO7816 of greater length or width. The essential, if the manufacturing method is to be economically advantageous, is the existence of a standard machine tool and method to manufacture the card. However this may result in the choice of a new format for which a new machine tool and a new mass production method are subsequently designed.

The manufacturing method according to the invention (FIGS. 4-5, 7-8, 10-11), may be carried out in a factory. Nevertheless, it may also be carried out by the customer, who receives, at the same time, the card 11 mounted in a format ID-1 card (see FIGS. 1 and 2) and the base 10 or 97 (depending on the desired form) including the cavity 47 or 17. The customer then detaches the card 11 from its base and inserts it in the cavity 17 to obtain a key, for example of "CANAL+" type.

Figure 12:
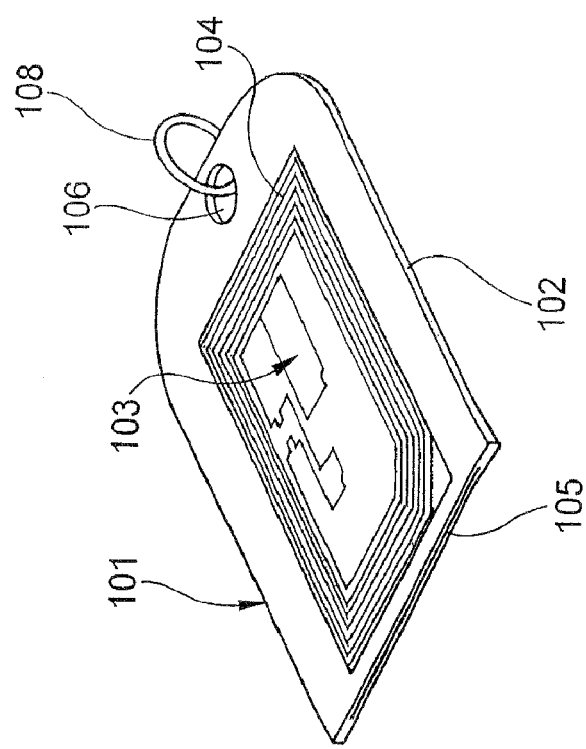
FIG. 12 is a perspective view of another microcircuit card according to the invention.
Figure 13:
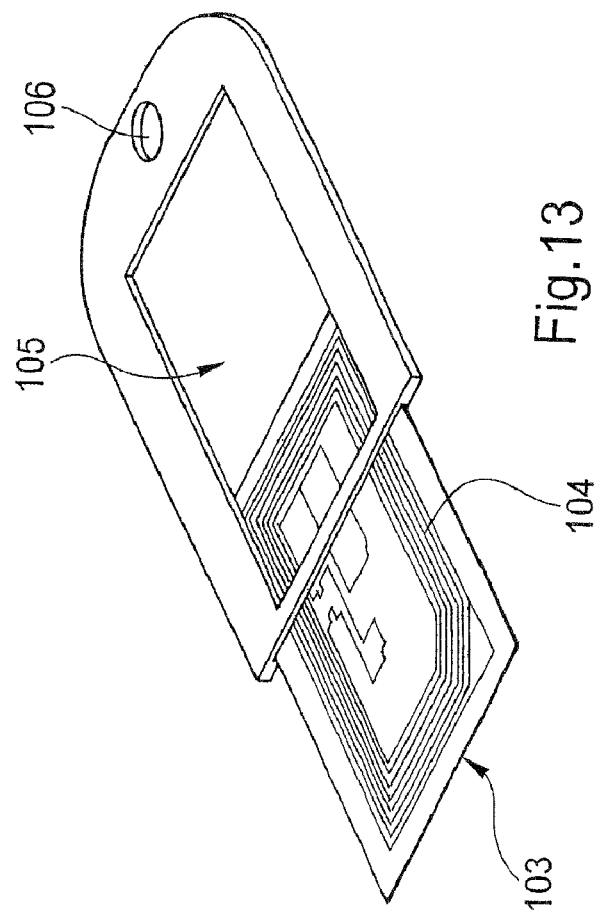
FIG. 13 is a perspective view of that card in course of assembly.

FIGS. 12 and 13 show a perspective view of another embodiment of a card according to the invention.

This microcircuit card, designated by the general reference 101, comprises a base 102 in a location of which a microcircuit card 103 of smaller size is arranged.

In a conventional manner, the small card 103 comprises a microcircuit, within a small card body which constitutes an internal part for the base.

The small card body is here provided with antenna 104, here visible as a plurality of printed tracks. The small card 103 is in fact a card of the type without contacts.

The base 102 is here a frame, in an edge which is provided the opening of a slot 105, which is thus formed in the thickness of that base.

As previously, the location in which the small card 103 is arranged, i.e. the slot 105, is a cavity provided with a bottom; but the cavity is here further provided with a roof, which together with the bottom, defines the aforementioned slot.

The bottom and the roof are here formed of edges bordering the aforementioned slot, and thus the card 103, over at least a portion of its periphery, preferably along at least it longitudinal sides, or even along the transverse side opposite to the opening of the slot.

The bottom and the roof are thus open (hence the frame form mentioned above), which facilitates communication of the antenna 104 with the exterior. Indeed it can be noted by comparison of FIGS. 12 and 13 that the antenna 104 is here entirely accessible from the exterior, without any coil formed in the peripheral region of the card which is sandwiched between the edges constituting the bottom and the roof.

The base is produced entirely of appropriate known material, preferably more mechanically rigid than the material constituting the body of the small card to be able to ensure effective mechanical protection of it.

Naturally the bottom and the roof may cover all or part of the small card if the material chosen is permeable to the waves which the antenna 104 may receive or emit. The bottom and/or the roof may furthermore be produced from a plurality of different materials from that of the rest of the base; thus the bottom and/or the roof may be formed in the form of transparent panels.

With just enough clearance to enable the small card to slide in the slot, the width of the latter is substantially equal to that of the internal part and is a height (or depth) substantially equal to the thickness of that internal part. The length of that slot (parallel to the plane of the base) is advantageously equal to or greater than the length of the small card, which permits the card to the well and fully engaged in the base.

One advantage of providing a slot longer than the small card is that in this manner it is possible to make it difficult, or even impossible, to later withdraw that small card from the base, especially if projections are provided at the entry of the slot, for example ribs forming a bevel which will, by an inclined flank, allow the introduction of the small card, but, by a vertical flank (in the direction of the thickness of the base), prevent the withdrawal of that card.

The small card may have dimensions that are identical or even smaller than those of the ID-000 standard used for example in mobile telephones. In particular in this case, the base may, in addition to its function of providing rigidity, have an ergonomic role in that it may facilitate the manipulation of the small card by the user.

Thus it can be seen in the FIGS. 12 and 13 that the base comprises a through-hole 106. The dimensions of this advantageously permit a ring 108 to be passed through it, for example a key ring. The card constituted by the small card in the base may thus be manipulated by the user with the same comfort as a key. Among all the possible forms for the base, whether simple or complex, that of a key may furthermore be mentioned.

The through-hole may be replaced by any other appropriate means of attachment and may co-operate not only with a ring but also with a screw-nut assembly, a snap-shackle at the end of a chain, etc.

The through-hole 106 is here arranged near the bottom of the slot. In a variant shown in FIG. 14C in dashed lines, through-hole 106' is formed in the bottom and the roof of the cavity, at the entry of the slot such that, if the slot is sufficiently longer than the small card, the installation of a key ring enables the small card to be blocked within the base.

Depending on its size, the base may further comprise visual information such as commercial logos or pictures.

It ought to be noted that, in FIGS. 3 to 11, the base comprises a cavity which opens by a face, whereas, in FIGS. 12 to 13, the base comprises a cavity which opens by an edge.

Figure 14C:
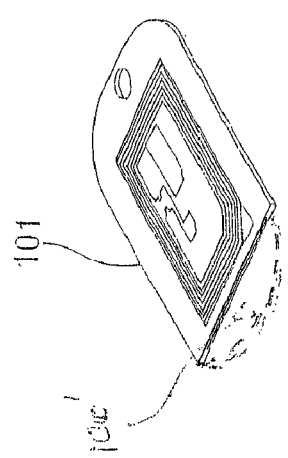
FIGS. 14A to 14C show a perspective view of three states in the manufacture of that card.
Figure 14B:
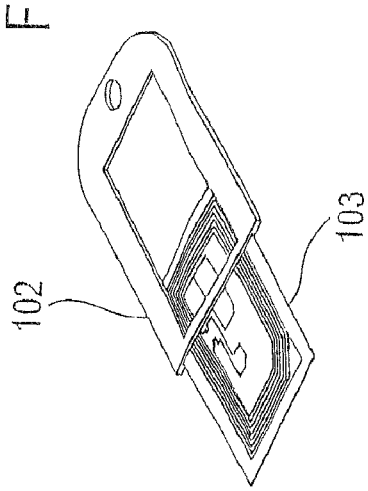
Figure 14A:
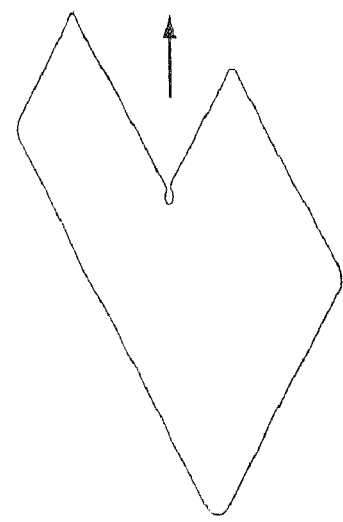
Figure 14A:
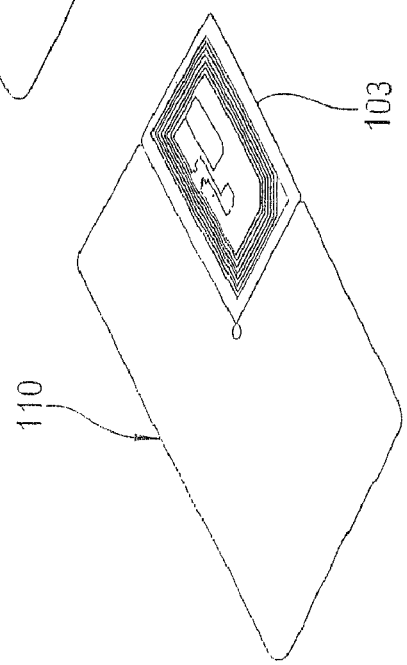

FIGS. 14A and 14C show three possible states in the manufacture of the card 101 of FIG. 12.

As shown in FIG. 14A, the future "small card 103" is manufactured within a larger base card 110, for example in format CR80, by appropriately combining an antenna and a microcircuit. This makes it possible to take best advantage of methods of standard manufacture, and personalization of microcircuit cards (stamping, cutting out or presplitting, sublimation or inkjet printing, laser engraving, etc.). This personalization may concern not only the microcircuit but also the rest of the base card in order to print on it commercial messages, logos, or even features of the final user.

Presplitting in practice performed in anticipation of a future detachment of the small card 103 from the rest of the base card 110.

In principle, after personalisation, the final user introduces the detachment of that small card 103 and engages it in the base 102 (see FIG. 14B).

In the final configuration of FIG. 14C (which corresponds to FIG. 12), the card 101 may be connected to a key ring or engaged in a telephone, a watch, a personal digital assistant, etc.

Indeed, the small card 103 may also be of the type with contacts, for example of the type with a double interface, with for example a base having the appropriate format (for example that of the standard ID-000).

As a general rule, the aforementioned microcircuit cards may be modified without difficulty so as to satisfy local standards, whether they be American or European.

It ought to be noted that it may be worthwhile to provide a through-hole in one of the bases of the cards of FIGS. 3 to 11, for example for their storage when not in use.

In a variant not shown, the small card 103 is engaged in a base provided with a cavity opening by a face.

The invention claimed is:

1. A method of making a microcircuit card assembly comprising the steps of:
   providing a base;
   providing a preliminary base including a small card having a microcircuit;
   personalizing at least the microcircuit of said small card;
   separating the small card from the remainder of said preliminary base after said step of personalization; and
   attaching said small card to said base, said small card being operational when attached to said base,
   wherein the base is provided with a pocket having a width substantially equal to a width of said small card and a length at least as long as a length of said small card so that said small card is held entirely within said pocket when inserted therein.

2. The method of claim 1, wherein said base is more mechanically rigid than said small card.

3. A method of making a microcircuit card assembly comprising the steps of:
   providing a base;
   providing a preliminary base including a small card having a microcircuit an antenna;
   personalizing at least the microcircuit of said small card;
   separating the small card from the remainder of said preliminary base after said step of personalization; and
   attaching said small card to said base, said small card being operational when attached to said base,
   wherein said base is provided with a pocket for attachment of the said small card and is permeable to electromagnetic energy received by said antenna so that said small card is fully operational when held entirely within said pocket.

4. A microcircuit card assembly comprising in combination:
   a base comprising an attachment area;
   a preliminary base including a small card having a microcircuit, at least said small card being personalized, and said small card being mountable, after separation from a remainder of said preliminary base, in said attachment area so as to be operational when attached to said base,
   wherein the base is provided with a pocket having a width substantially equal to a width of said small card and a length at least as long as a length of said small card so that said small card is held entirely within said pocket when inserted therein.

5. The microcircuit card assembly of claim 4, wherein said base is more mechanically rigid than said small card.

6. A microcircuit card assembly comprising in combination:
   a base comprising an attachment area;
   a preliminary base including a small card having a microcircuit an antenna, at least said small card being personalized, and said small card being mountable, after separation from a remainder of said preliminary base, in said attachment area so as to be operational when attached to said base,
   wherein said base is provided with a pocket for attachment of the said small card and is permeable to electromagnetic energy received by said antenna so that said small card is fully operational when held entirely within said pocket.

* * * * *